United States Patent [19]
McKinley

[11] Patent Number: 5,875,549
[45] Date of Patent: Mar. 2, 1999

[54] METHOD OF FORMING INTERNAL PASSAGES WITHIN ARTICLES AND ARTICLES FORMED BY SAME

[75] Inventor: Barry Lee McKinley, Chuluota, Fla.

[73] Assignee: Siemens Westinghouse Power Corporation, Orlando, Fla.

[21] Appl. No.: 819,381

[22] Filed: Mar. 17, 1997

[51] Int. Cl.[6] .................................................. B23P 17/00
[52] U.S. Cl. .................. 29/889.2; 29/889; 29/890.1; 29/890.02; 29/527.6; 29/889.7; 29/889.71; 216/39; 216/52; 427/551; 427/566; 427/585; 264/241
[58] Field of Search ..................... 428/167, 172, 428/188; 29/889.2, 889, 527.6, 889.7, 889.71, 890.01, 890.02; 264/413, 209.1, 241; 216/39, 52, 63; 427/551, 566, 585, 290; 164/23, 46, 518, 519

[56] References Cited

U.S. PATENT DOCUMENTS

| | | | |
|---|---|---|---|
| 2,831,688 | 4/1958 | Knox | 428/72 |
| 5,075,966 | 12/1991 | Mantkowski | 29/890.01 |
| 5,206,067 | 4/1993 | Bonzo | 428/119 |
| 5,435,889 | 7/1995 | Dietrich | 216/63 |

*Primary Examiner*—Donald Loney

[57] ABSTRACT

A method of producing numerous small passages within a turbomachinery component is disclosed. The method comprises providing a turbomachinery component substrate having grooves, filling the grooves with a filler, condensing a vapor onto the surfaces of the substrate and the filler, and removing the filler. The method enables the formation of small passages located close to the component surface without the low yield rate associated with conventional methods of turbomachinery component production. Turbomachinery components having numerous small passages for cooling are also disclosed. Such passages may diminish fluid pressure losses of a cooling medium passing therethrough.

9 Claims, 6 Drawing Sheets

METHOD OF FORMING INTERNAL PASSAGES WITHIN ARTICLES AND ARTICLES FORMED BY SAME

FIELD OF THE INVENTION

This invention relates to articles having small passages extending therethrough, and to a method of producing such passages. More particularly, this invention relates to turbomachinery components having small passages, and to a corresponding method for producing such passages.

BACKGROUND OF THE INVENTION

Recent advances in technology enable a substrate to be coated by condensing a vapor onto the substrate. Using the vapor deposition method, coatings may enhance or augment chemical, physical, or electromagnetic properties of the substrate. Depending on the properties sought, coatings may be formed of either the same material as the substrate or a different material, such as a corrosion resistant alloy.

A common method of forming a vapor uses an electron gun to focus a beam of electrons on the surface of an evaporant material, which often is a metal. The electron beam causes high localized temperatures on the surface, which vaporizes a portion of the metal evaporant. The metal vapor occupies a deposition chamber, which has a high concentration of the metal vapor because the chamber is evacuated of gases before vaporizing begins. The vapor condenses on articles placed within the deposition chamber. The condensed metal cools until it forms a solid coating on the article. The thickness of the coating is controlled by varying the operating conditions, such as vapor pressure, temperature, deposition time, and mechanical manipulation of the substrate. Vapor phase deposition methods utilizing an electron beam are currently in widespread use. A wide variety of articles, for example turbine components, may be coated by vapor deposition.

The turbine section and combustion section of a gas turbine are subjected to high temperatures. The temperatures of combustion gases entering the turbine often exceed the maximum operating rating of the alloys from which the turbomachinery components are formed. Turbomachinery components include, for example, turbine blades, vanes, and walls.

Because turbomachinery components are subjected to high temperatures, they typically are cooled to maintain their structural integrity. Air is diverted from the turbine compressor outlet to cool the turbine blades, vanes, and walls. However, using compressor air for cooling diminishes turbine efficiency because such air is unavailable to support combustion. Thus, it is desirable to use a minimal amount of compressor air to cool the turbomachinery components.

Generally, cooling is accomplished by passing a constant flow of air through internal passages within the component. To achieve constant cooling air flow throughout an airfoil, internal airfoil static pressure must exceed airfoil external pressure. If external pressure exceeds internal pressure, combustion gases flow into the airfoil interior, which interrupts the cooling air flow and may damage the airfoil by overheating.

Moreover, cooling air loses pressure as it passes through serpentine passages or small film holes common to most air-cooled airfoils. Therefore, fluid pressure losses must be minimized to maintain internal pressure higher than external pressure.

There exists a need for airfoils and other turbomachinery components that have internal cooling passages that provide low cooling air pressure loss.

Conventional methods of fabricating airfoils employ both a casting step and an extensive machining step. The casting step requires fabricating a mold and a core. The core is supported within the mold by core support members. Molten metal is poured into the mold around the core and the core support members. After the metal cools, the core and core support members are dissolved by applying a chemical solution. Dissolving the core support members forms holes within the airfoil casting. The cast airfoil is then machined into its final shape. The cooling passages within the airfoil are formed by the voids that remain in the casting after the core is dissolved. Thus, the geometry of the mold core determines the shape and size of the passages.

The conventional method of producing airfoil passages has numerous drawbacks, including the high cost of machining. Moreover, the fabrication of the mold core is especially complex because of the intricate shapes of the cooling passages.

Furthermore, because of inherent limitations of the casting process, the passages must be larger than optimum and set deeply beneath a thick airfoil wall. For example, high temperature steel alloy blades of commercial, large-scale combustion turbines often have wall thickness of 0.189 inches maximum to 0.070 inches minimum. These dimensions would be typical of row one and two turbine blades used on Westinghouse frame 501G. Unfortunately, large, deep passages are less efficient at transferring heat from the airfoil than airfoils with cooling passages located closer to the airfoil outer surface, as is well understood in the art. The lower heat transfer efficiency of large, deeply set passages requires more cooling air, which diminishes overall turbine efficiency. Attempting by conventional methods to produce smaller passages and thinner airfoil walls is expensive and may result in a prohibitively low yield rate.

There exists a need for a reliable method for forming airfoils and other turbomachinery components having numerous small cooling passages that are located very close to the airfoil surface, without the prohibitively low yield rate of conventional methods. There also exists a need for airfoils and other turbomachinery components that have such passages.

SUMMARY OF THE INVENTION

A reliable method for producing small passages within turbomachinery components is provided by this invention. The method comprises providing a substrate having grooves, filling the grooves with a filler material, condensing a vapor onto the surfaces of the substrate and the filler material, and removing the filler material. Although used to produce airfoils and other turbomachinery components, the method may also be used to produce other articles requiring passages.

In a preferred practice of the invention, turbomachinery components having numerous small passages close to the turbomachinery component surface are provided. The passages enable a cooling medium to pass therethrough for cooling the component.

DETAILED DESCRIPTION OF THE PREFERRED EMBODIMENTS

For simplicity, the present invention will be described in the context of a turbine blade. However, the invention may be applied to any turbomachinery component. The term "turbomachinery component" as used herein and in the appended claims, includes a turbine blade, a turbine vane, a turbine transition duct wall, and any other machinery component that requires cooling.

Figure 1A:
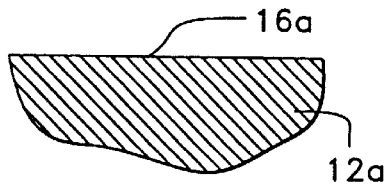
FIGS. 1A through 1E are views of a turbine blade casting at various stages of forming passages, according to the present invention.

Now referring to the drawings, wherein like reference numerals designate corresponding structure throughout the views, there is illustrated in FIGS. 1A through 1E partial views of a turbine blade casting in progressive stages of manufacture in accordance with the present invention. FIGS. 3 AND 4 show a complete turbine components having such passages. Referring to FIG. 1A, a turbine blade substrate 12a having a substrate surface 16a is shown. Although the surface 16a is shown flat throughout FIGS. 1A through 1E, the method according to the present invention is equally applicable to curved surfaces, as shown in FIG. 3C.

Figure 1B:
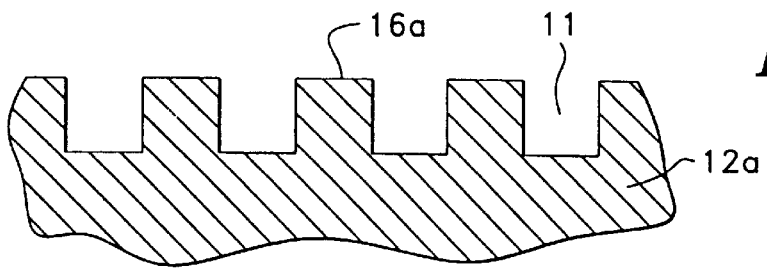

Referring to FIG. 1B, a plurality of grooves 11 is formed in the substrate surface 16a. The grooves may be formed by either machining grooves into the turbine blade substrate surface 16a or by casting the turbine blade in such a manner that grooves 11 are formed by the casting process.

Because grooves, and ultimately passages, may be readily formed by this method, fluid pressure losses may be minimized by properly sizing the total cross sectional area of the passages and by forming the passages with smooth walls without sharp bends. Thus, size and quantity of the grooves 11 may depend on the design characteristics of the particular application. For example, in the practice of the present invention the grooves 11 in a commercial combustion turbine blade may be as small as approximately 0.080 inches wide and 0.080 inches deep. Further exemplifying the practice of the present invention, the center lines 13 of each one of the grooves 11 may be displaced as little as 0.160 inches apart.

Figure 1C:
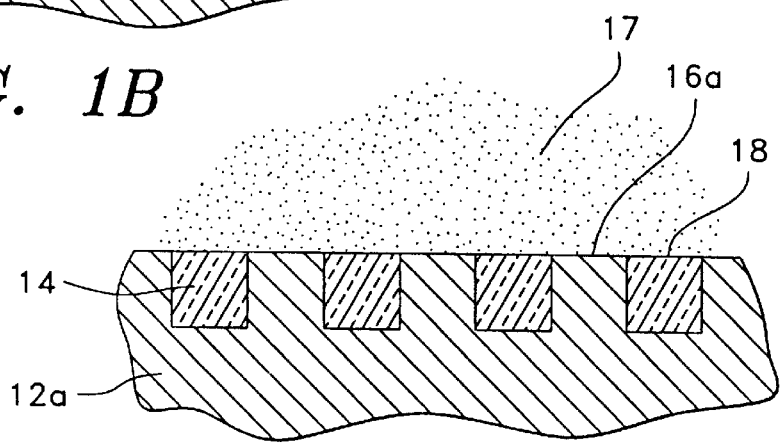

Referring to FIG. 1C, the grooves 11 are filled with a filler 14, which may be formed from a material such as a ceramic material or a metal salt material. However, using a ceramic material to fill the grooves is preferred. After the grooves 11 are filled, a filler surface 18 and the substrate surface 16a are polished, which simultaneously exposes the substrate surface 16a and conforms the filler surface 18 to a substantially similar slope and shape as the substrate surface 16a. Thus, polishing prepares the turbine blade surface for condensing of a vapor 17.

Figure 1D:
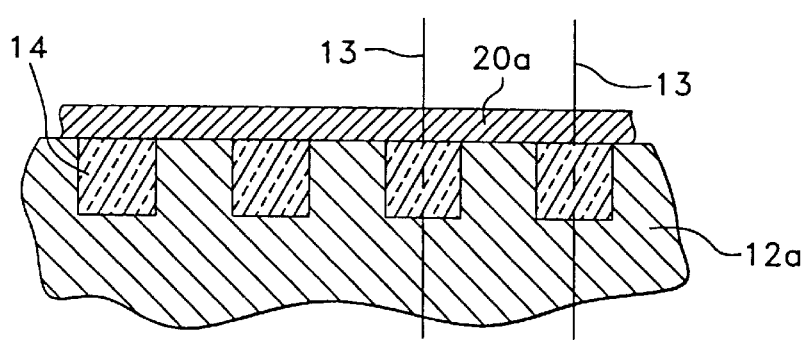
Figure 2:
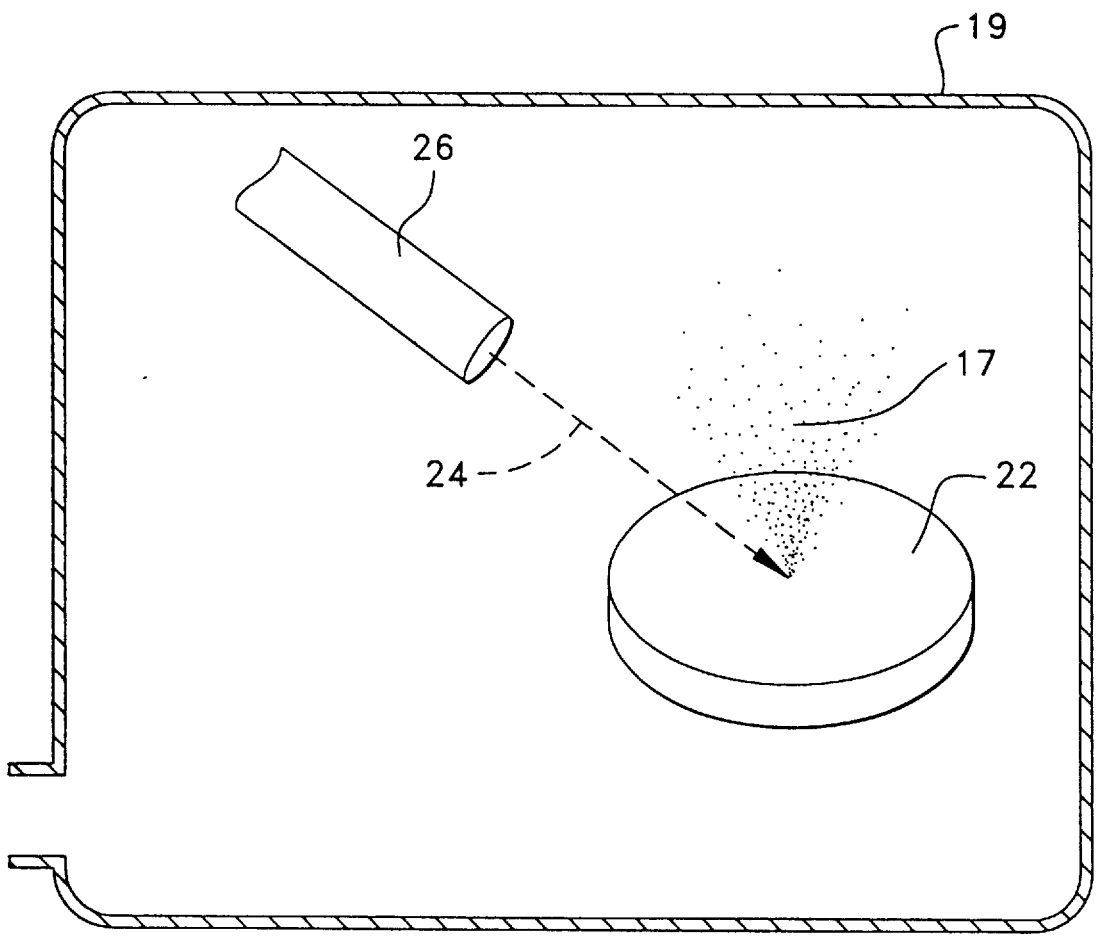
FIG. 2 is a diagrammatical view of conventional vapor processing equipment.

Conventional vapor phase processing equipment is shown FIG. 2. A vapor 17 is formed within a deposition chamber 19 by an electron beam 24. Emitted by a conventional electron gun 26, the electron beam 24 impinges on the surface of an evaporant material 22, as shown in FIG. 1D. The vapor 17 condenses on the filler surface 18 and the turbine blade substrate surface, which is located within the deposition chamber 19. Preferably, the turbine blade is robotically manipulated in order to form a uniform skin 20a, 20b, 20c, 20d thickness. Suitable vapor phase processing can be performed by Chromalloy Turbine Technologies, a subsidiary of Chromalloy Gas Turbine Corp., 105 Tower Drive, Middletown, N.Y. 10940 and by Interturbine, 1170-111th Street, Grand Prairie, Tex. 75050.

The skin 20a, 20b, 20c, 20d may be thin relative to other airfoil dimensions. For example, skin 20a, 20b, 20c thickness may be approximately 0.025 to 0.030 inches compared with an airfoil chord length of several inches, as shown in FIGS. 3C. Preferably, the skin 20a, 20b, 20c, 20d is formed of the same steel alloy as the substrate material 12a, 12b, 12c, 12d. However, the invention provides for skin 20a, 20b, 20c, 20d to be formed of materials dissimilar to the substrate 12a, 12b, 12c, 12d.

Figure 1E:
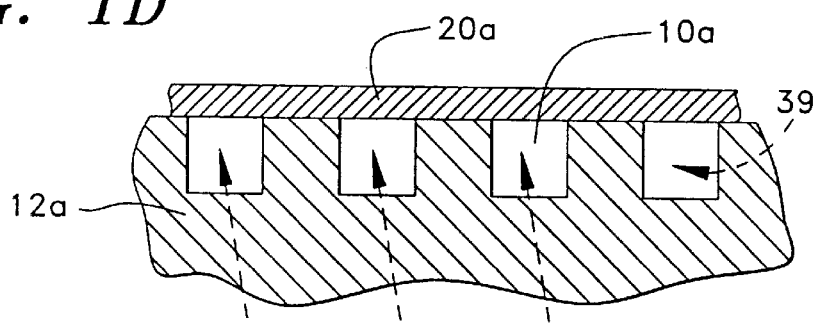

After the skin 20a is formed on the substrate surface 16a and filler surface 18, the filler 14 is removed from the grooves 11. In the preferred method, the filler 14 is removed by exposure to a caustic solution. The methods of removing the filler material 14 using a caustic solution are well known in the investment casting art. These methods include a low or high temperature salt bath of potassium hydroxide or through the use of an autoclave. When the filler 14 is removed from the grooves 11, the skin 20a and substrate 12a remain to form passages 10a, as shown in FIG. 1E.

In the preferred embodiment, the skin 20a, 20b, 20c, 20d thickness is designed to substantially withstand the stress caused as a pressurized cooling medium 39 flows through the passages 10a, 10b, 10c, 10d and the stress inherent in the differential expansion between the skin 20a, 20b, 20c, 20d and substrate 12a, 12b, 12c, 12d.

Figure 3A:
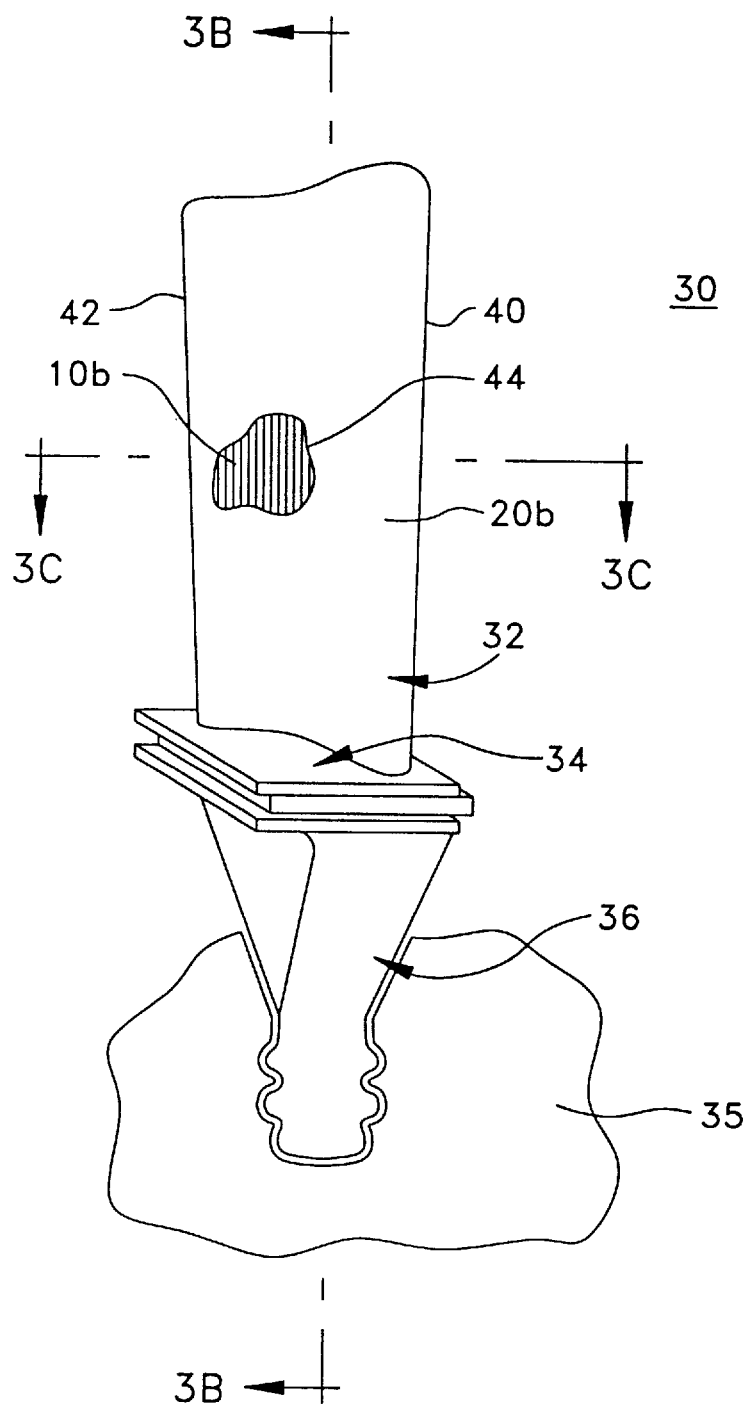
FIG. 3A is an elevation of a turbomachinery component having passages that are formed in accordance with the present invention.
Figure 3C:
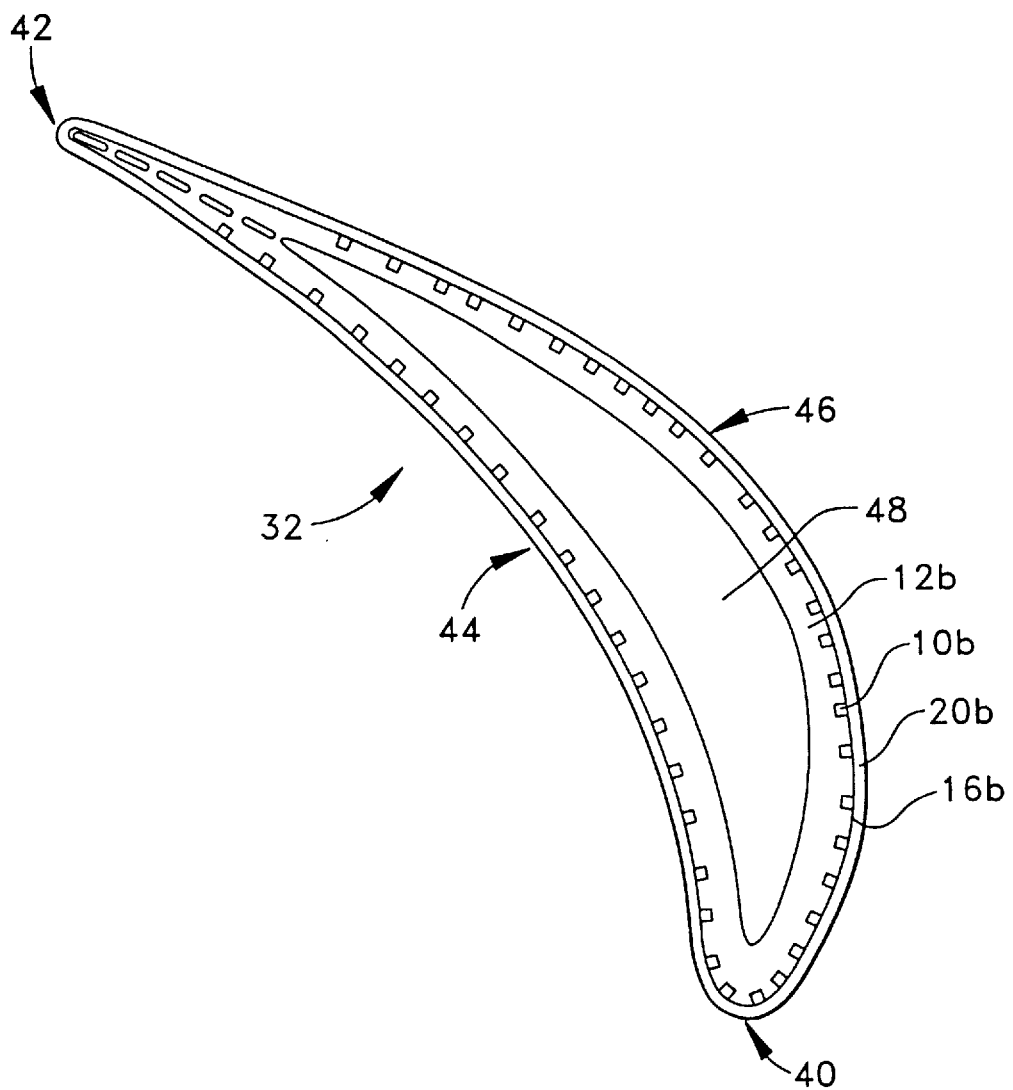
FIG. 3C is a cross section taken through line 3C of FIG. 3A.
Figure 4:
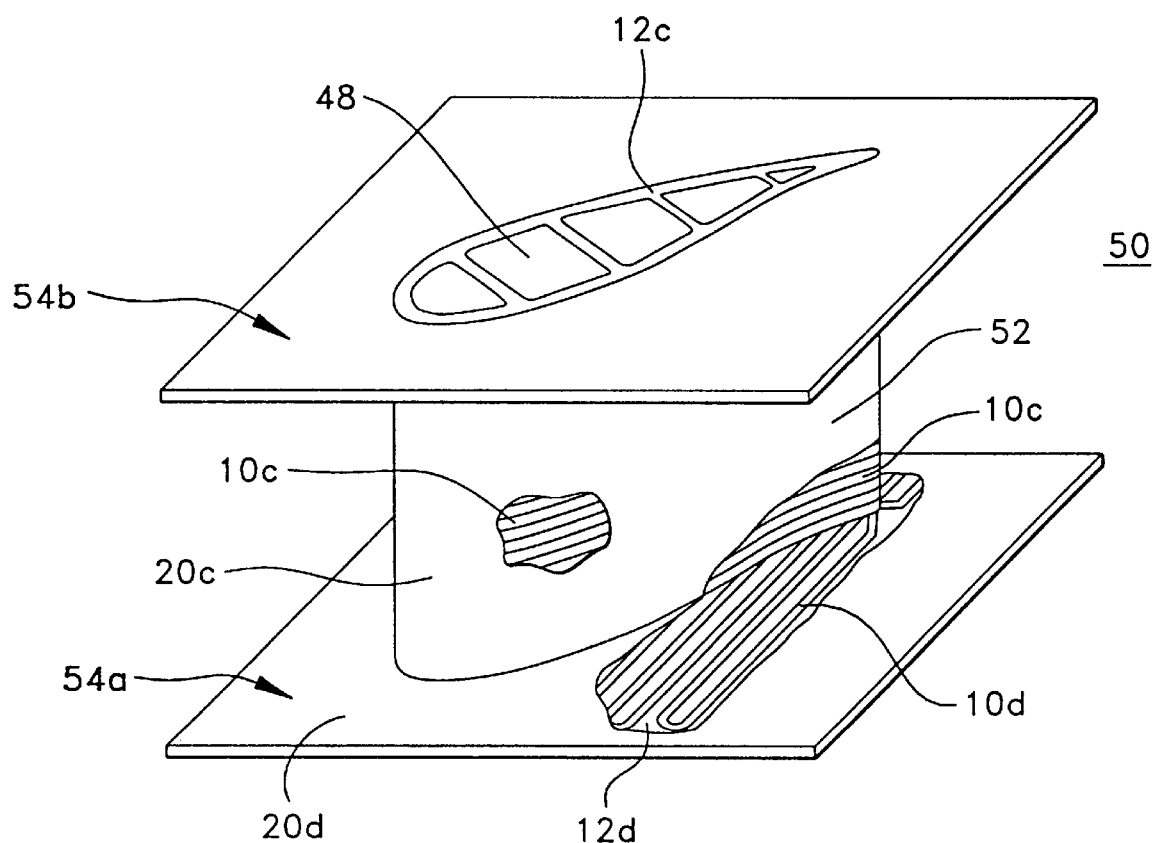
FIG. 4 is a view of a turbine vane having passages that are formed in accordance with the present invention.

Referring now to FIG. 3A, an exemplary turbine blade assembly 30 is shown as having an airfoil portion 32, a platform 34, and a root 36. The blade assembly 30 is mounted by the root 36 in a corresponding slot in the turbine rotor rim 35. The airfoil 32 includes a leading edge 40, a trailing edge 42, a concave face 44, an a convex face 46. According to the present invention, a plurality of airfoil passages 10b are disposed beneath an airfoil skin 20b. As shown in FIG. 3C, the airfoil passages 10b may be disposed approximately equidistant around the perimeter of the airfoil 32.

Figure 3B:
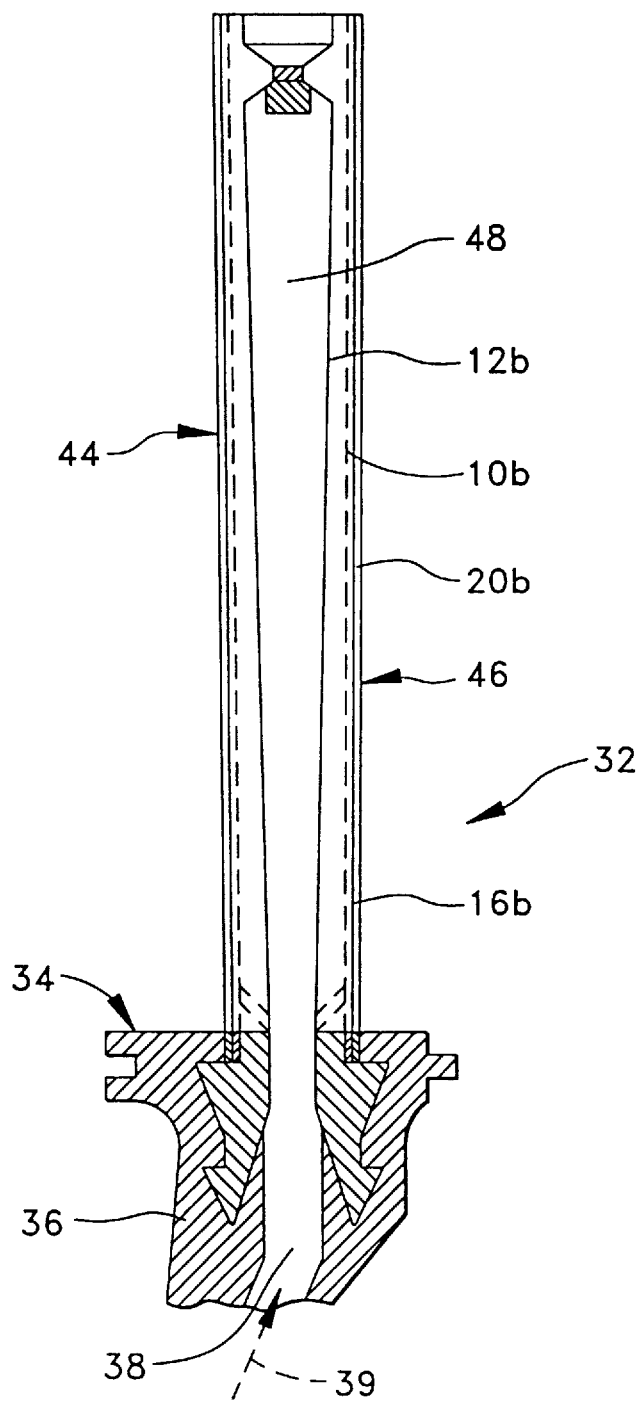
FIG. 3B is a cross section taken through line 3B of FIG. 3A.

Referring to FIG. 3B, the airfoil passages 10b are disposed within a blade casting substrate 12b. The airfoil passages 10b are in pressurized communication with the root passage 38, the airfoil core 48, or a combination of both, thus enabling a cooling medium 39 to flow through the passages 10b. Preferably, the cooling medium 39 for turbine blades comprises compressed air, although steam may also be used. The cooling medium 39 exits the airfoil 32 through holes disposed in the distal end of the airfoil 32 (not shown).

Referring to FIG. 4, a exemplary turbine vane assembly 50 having passages formed in accordance with the present invention is shown. The turbine vane 50 has an airfoil portion 52 and two shrouds 54a, 54b. Airfoil passages 10c are disposed within a vane substrate 12c beneath a vane skin 20c. Further, shroud passages 10d formed by the method herein are disposed within a shroud substrate 12d of each shroud 54a, 54b. The shroud passages 10d connect to the airfoil passages 10c via holes thorough the airfoil (not shown). Preferably, the vane passages 10c and shroud passages 10d form a closed loop through which steam flows for cooling. Alternatively, compressed air may be passed through the closed loop for cooling.

Although FIGS. 3 and 4 each show a single orientation of passages, the present invention encompasses any combination of radial, tangential, and obliquely oriented passages produced by the method herein. Moreover, it is to be understood that even though numerous characteristics and advantageous of the present invention have been set forth in the forgoing description, together with details of the structure and function of the invention, the disclosure is illustrative only, and changes may be made in detail, especially in matters of shape, size, and arrangement of parts, passages, and method within the principles of the invention to the full extent indicated by the broad general meaning of the terms in which the appended claims are expressed.

I claim:

1. A method of producing passages within an article comprising the steps of:
    (a) providing a substrate having a substrate surface having a plurality of grooves;
    (b) filling at least a portion of at least one of the grooves with a filler, the filler having a surface;
    (c) forming a vapor of an evaporant;
    (d) condensing the vapor onto the substrate surface and onto the filler surface, so as to form a skin thereon; and,
    (e) removing the filler from at least one of the grooves while leaving the skin substantially intact, thereby forming at least one passage within the substrate suitable for enabling a cooling medium to pass therethrough for removing heat from the substrate and the skin.

2. The method of claim 1 wherein the step of providing the substrate having a plurality of grooves comprises at least one of the steps of: casting the substrate with the grooves formed therein; and, machining the grooves into the substrate.

3. The method of claim 1 wherein the substrate comprises a turbomachinery component.

4. The method of claim 1 wherein the filler is formed from a material comprising one of a ceramic material and a metal salt material.

5. The method of claim 1 wherein the skin is formed so as to have a substantially uniform thickness across the substrate surface and the filler surface.

6. The method of claim 1 further comprising the steps of polishing the substrate surface and polishing the filler surface to a substantially similar slope and shape to provide an even profile on which to condense the vapor.

7. The method of claim 1 wherein the vapor is produced by an electron beam impinging directly on the evaporant.

8. The method of claim 1 wherein the step of removing the filler includes dissolving the filler with a caustic solution.

9. The method of claim 1 wherein the evaporant comprises a substantially similar material as the substrate.

* * * * *